(12) United States Patent
Takemoto et al.

(10) Patent No.: US 7,088,834 B2
(45) Date of Patent: Aug. 8, 2006

(54) AUDIO APPARATUS, AUDIO VOLUME CONTROL METHOD IN AUDIO APPARATUS, AND COMPUTER APPARATUS

(75) Inventors: Riho Takemoto, Yamato (JP); Masaharu Itoh, Yamato (JP)

(73) Assignee: Lenovo Pte. Ltd., Singapore ( * ) Notice: Subject to any disclaimer, the term of this patent is extended or adjusted under 35 U.S.C. 154(b) by 743 days.

(21) Appl. No.: 09/934,888

(22) Filed: Aug. 22, 2001

(65) Prior Publication Data
US 2002/0039426 A1  Apr. 4, 2002

(30) Foreign Application Priority Data
Oct. 4, 2000  (JP) .............................. 2000-305059

(51) Int. Cl.
*H03G 3/00* (2006.01)
(52) U.S. Cl. ...................... 381/104; 381/107
(58) Field of Classification Search .............. 381/104, 381/107, 333, 306, 98, 103; 700/94
See application file for complete search history.

(56) References Cited

U.S. PATENT DOCUMENTS 5,355,531 A * 10/1994 Iwata et al. ................ 455/219
6,122,701 A * 9/2000 Kunkel ....................... 710/267
6,148,243 A * 11/2000 Ishii et al. .................... 700/94
6,321,278 B1 * 11/2001 Phu et al. ...................... 710/14
6,408,187 B1 * 6/2002 Merriam .................... 455/458
6,704,421 B1 * 3/2004 Kitamura ................... 381/103

FOREIGN PATENT DOCUMENTS

| JP | 61-231623 | 10/1986 |
| JP | 05-283958 | 10/1993 |
| JP | 06-085969 | 3/1994 |
| JP | 08-079877 | 3/1996 |
| JP | 08-241176 | 9/1996 |
| JP | 08-280050 | 10/1996 |
| JP | 09-064945 | 3/1997 |
| JP | 10-304452 | 11/1998 |
| JP | 11-234792 | 8/1999 |
| JP | 11-252665 | 9/1999 |
| JP | 2000-184457 | 6/2000 |

* cited by examiner

*Primary Examiner*—Brian T. Pendleton
(74) *Attorney, Agent, or Firm*—Sawyer Law Group LLP

(57) ABSTRACT

An audio apparatus that enables audio output and volume to be controlled according to the usage situation is provided for. In an audio apparatus of the present invention, certain hypothetical connection situations are compared with actual connection situations, and when the actual connection situation matches a described hypothetical connection situation, the audio volume corresponding to that hypothetical connection situation is extracted from storage, and is used as the audio volume to be output from the audio apparatus.

15 Claims, 8 Drawing Sheets

Figure 5

| | AC connection? | Headphone connection? (external speaker connection?) | LAN connection? | Docking connection? |
|---|---|---|---|---|
| 1. Volume = Mute | NO | NO | YES/NO | YES/NO |
| 2. Volume = Low | YES | NO | NO | YES/NO |
| 3. Volume = Fairly low | YES | NO | YES | YES |
| 4. Volume = No change | YES/NO | YES | YES/NO | YES/NO |

Figure 8

| Place of use | Situation | Permissible audio volume |
|---|---|---|
| Office | · Connected to AC power supply<br>· Connected to network<br>· Headphones not connected | Low to medium |
| Conference room | · Battery mode<br>· Not connected to network<br>· Headphones not connected | Mute to low |
| Train | · Battery mode<br>· Not connected to network<br>· Headphones not connected | Mute |
| Playing DVD at home | · Connected to AC power supply<br>· Not connected to network<br>· Headphones connected | Medium to high |

AUDIO APPARATUS, AUDIO VOLUME CONTROL METHOD IN AUDIO APPARATUS, AND COMPUTER APPARATUS

BACKGROUND OF THE INVENTION

1. Field of the Invention

The present invention relates to audio volume control in an audio apparatus such as a notebook type personal computer (referred to as "notebook PC" below).

2. Description of the Related Art

A personal computer (referred to hereinafter as a "PC") does not simply execute computations, but also presupposes a demand for audio capability. For example, the typical PC now has audio and video functions as an AV (Audio Visual) apparatus. To be more precise, PCs are used as televisions, or as playback apparatuses for music CDs (Compact Discs) or DVDs (Digital Video Discs). A PC may also be used to function as a playback apparatus for subsequent playback of an MP3 type file downloaded using the data storage function of the PC. Also, as there are Web Sites that include audio, audio output related to Internet connection is also a presupposition for PCs.

Meanwhile, a PC has a plurality of areas called windows as image display areas, and multiwindow display is implemented whereby a plurality of kinds of display information are displayed simultaneously in these windows. With regard to audio output of a PC comprising this multi-window function, Published Unexamined Patent Application No. 6-51930 proposes that, when first image information is displayed in a prescribed window and audio corresponding to that first image information is being output, and second image information is to be displayed as an icon image, the icon image be displayed in relation to audio corresponding to the second image information. Accordingly, the audio corresponding to the second image information can be recognized without hindering aural perception of the audio of the first image information.

However, in practice, PCs are not used only as AV apparatuses. That is, with a pure AV apparatus, a presupposition is that audio will be emitted constantly when it is in use. However, in the case of a PC, excluding the case where it is used as an AV apparatus, there may be times when audio output is not anticipated. For example, in the case of an above described Web Site that includes audio, a user accessing the Web Site normally cannot anticipate the timing at which audio will be output.

Also, a particular PC is not necessarily used at a fixed location. In the case of notebook PCs in particular, with their excellent portability, a presupposition can be said to be that they are used in a variety of locations. Assuming use for business, although the notebook PC user's office is the base for use of the PC, the PC may also be taken to meetings or used in the train when the user is away from the office. For instance, notebook PCs, in particular, are used in a variety of places, and depending on the place of use, it may be undesirable for audio to be output unexpectedly. Unexpected audio output where it is undesirable, such as in a train or in a meeting, for example, will be frowned upon by others present. The same applies if excessively loud audio is outputted. As notebook PCs are provided with a function for controlling audio volume, this problem can be avoided if the user takes care, but it is troublesome for the user to have to adjust the volume each time the place of use is changed, and it is quite conceivable that the user will sometimes forget to make such adjustments.

Moreover, it may also happen that audio is not yielded although the user wants it to be. Notebook PCs also include a mute function for audio as standard, and the user can select muting as necessary. However, the user himself or herself may forget that muting has been selected, and in this case it may happen that audio is not output although the user wants it to be. The user may perform inappropriate operations because he or she cannot understand why audio is not being output despite attempts to achieve this. Also, when muting is canceled, audio output is performed at the volume prior to muting, and it may happen that muting is canceled in a location where a high audio volume is inappropriate.

Consequently, the present invention concerns the provision of an audio apparatus—for example, a notebook PC as described above—that can control audio output according to the place of use.

BRIEF DESCRIPTION OF THE DRAWINGS

FIG. 5 is a chart of the correspondence between external connection situations and audio volumes in the present embodiment;

FIG. 8 is a chart showing the correspondence between the place of use, permissible audio volume, and external connection situation of a notebook PC.

SUMMARY OF THE INVENTION

Figure 1:
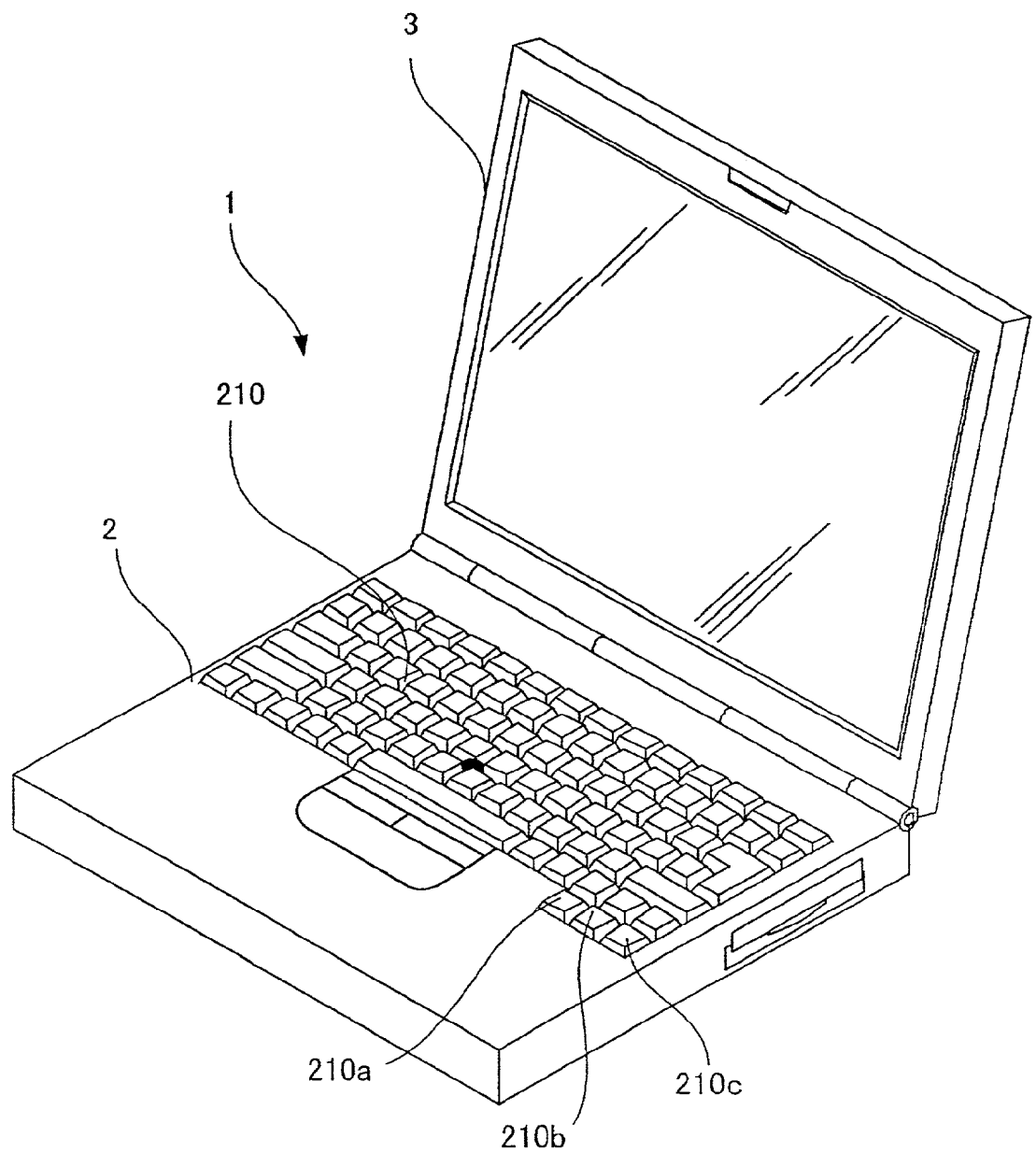
FIG. 1 is an oblique drawing of a notebook PC according to the present embodiment.

There is a relationship between the situation in which a notebook PC is used and the audio volume that is permissible in that situation. For example, to consider four kinds of DVD use—in an office, in a conference room with a meeting in progress, in a train, and at home—the audio volume in each usage situation is as shown in FIG. 8. For example, when a notebook PC is used for business in an office, a moderate volume (low to medium) is permissible. However, during a meeting in a conference room, it is desirable for audio not be output from a notebook PC (to be muted), or for the volume to be low if audio is output. In a train, audio should not be output (should be muted) so as not to annoy fellow passengers. When a DVD is played in the home, on the other hand, it is permissible for the volume to be adjusted according to the DVD program (medium to high). As described above, the permissible volume can be said to be more or less fixed according to where a notebook PC is used. Therefore, the problem of unanticipated audio output can be solved if the audio volume of a notebook PC can be controlled automatically according to where it is used.

An object of the invention is to include inventive aspects which provide utility in the recognition that there are differences in the usage situation of a notebook PC according to where it is used.

For example, to consider the power supply source, when a notebook PC is used in an office, it will generally be connected to the commercial AC power supply. When a notebook PC is taken to a conference room, its built-in battery will generally be used as the power supply source, rather than AC power. Of course, if a long meeting is anticipated, the user may connect the notebook PC to the AC power supply to avoid running down the battery. When a notebook PC is used in a train, the battery is the power supply source without exception. As shown above, if the power supply source is known, it is possible to infer roughly where a notebook PC is being used.

The accuracy of inference as to the place of use can be improved by adding other information concerning the external connection situation of a notebook PC. Recently, the construction of LANs (Local Area Networks) within offices has become widespread, and the place of use can also be inferred from knowledge of whether or not a notebook PC is connected to such a network. For example, when a DVD is played in a conference room, in a train, or at home, the notebook PC will not be connected to a network. Conversely, if a notebook PC is connected to a network, it can be inferred that it is being used in an office.

Whether or not headphones are connected can also be used to improve the accuracy of inference as to the place of use. For example, when a DVD is played at home, headphones may be connected because there is a lack of presence with only the notebook PC's built-in speaker. On the other hand, headphones are not usually connected when a notebook PC is used in an office, in a conference room, or in a train.

As shown above, the external connection situation of a notebook PC—that is, its usage situation—differs according to its place of use. Therefore, the place of use of a notebook PC can be inferred from knowledge of its usage situation.

The present invention was achieved based on the perception of the above points, and is an audio apparatus comprising recognizing means for recognizing the external connection situation, audio volume setting means for setting the audio volume according to the external connection situation recognized by the above described recognizing means, and a built-in speaker for outputting the audio volume set by the above described audio volume setting means. The audio apparatus of the present invention can output an audio volume that is set according to the external connection situation, and so can prevent output of an audio volume that is unexpected in its place of use.

The recognizing means of the present invention can recognize one, or two or more, of the following as the above described external connection situations: connection to a power supply source, connection to a network, connection to an external audio output apparatus, and connection to a peripheral apparatus. In concrete terms, this is because, with regard to these connection situations, the place of use of the audio apparatus can be inferred from information relating to connection or non-connection. Since one, or two or more, connection situations can be recognized, recognition of just one of the above described connection situations is acceptable. However, to improve the accuracy of inference, it is desirable for a plurality of connection situations to be recognized.

When the recognizing means of the present invention carries out the above described function, the audio volume setting means can set an audio volume according to one, or a combination of two or more, of the following connection situations: connection to a power supply source, connection to a network, connection to an external speaker, and connection to a peripheral apparatus. Since an external connection situation is information that specifies the place of use of the relevant audio apparatus, as described above, it is possible to output an audio volume that accords with the place of use.

As explained earlier, there are also places where it is desirable that audio output should not be performed. Therefore, the audio volume setting means in the present invention can not only increase and decrease, but also mute, the audio volume. Here, muting normally means making the output audio volume zero, and muting in the present invention also has this meaning. Even though the output audio volume becomes zero, the initially set audio volume value normally is not changed. This is in order to obtain the pre-muting audio volume after muting is canceled.

As explained earlier, the purpose of recognizing the situation with respect to the external environment is to infer the place of use of the relevant audio apparatus. The present invention then adjusts the audio volume output from the audio apparatus to a volume that accords with its external connection situation. That is to say, the present invention provides an audio volume control method in an audio apparatus whereby hypothetical external connection situations and audio volumes corresponding to those connection situations are stored in a relational fashion, and when the audio apparatus is actually used, the above described hypothetical connection situations are compared with the actual connection situation, and when the above described actual connection situation matches an above described hypothetical connection situation, the audio volume corresponding to that hypothetical connection situation is extracted from the above described storage contents, and is used as the audio volume to be output from that audio apparatus.

With the audio volume control method in the audio apparatus of the present invention, when the external connection situation changes, audio volume control functions sequentially. That is, with the audio volume control method in the audio apparatus of the present invention, when the actual connection situation of the above described audio apparatus changes, the above described hypothetical connection situations and the actual connection situation are compared, and the audio volume output from that audio apparatus can be adjusted on the basis of the result.

It has been stated above that a notebook PC is a typical example of the audio apparatus of the present invention. Therefore, the present invention provides a computer apparatus comprising a built-in speaker incorporated into the computer apparatus, audio volume control means for controlling the audio volume output from the above described built-in speaker, storage means for storing, in relational fashion, hypothetical computer apparatus usage situations and audio volumes corresponding to those usage situations, and recognizing means for recognizing the actual usage situation of the computer apparatus; wherein the above described audio volume control means selects, on the basis of the actual usage situation recognized by the above described recognizing means, an audio volume suitable for that usage situation from the above described storage means and adjusts that selected audio volume to the audio volume output from the above described built-in speaker.

The computer apparatus of the present invention comprises storage means for storing, in relational fashion, hypothetical computer apparatus usage situations and audio volumes suitable for those usage situations. This storage means is such that, for example, the audio volume is set to low when the computer apparatus is used connected to a network, is muted when the battery is used as the power supply source, and is set to high when the computer apparatus is used with an external speaker connected.

An audio volume suitable for the actual usage situation of the computer apparatus recognized by the recognizing means is then selected, and the audio volume is output from the built-in speaker. In the above computer apparatus, the power supply source is one factor for recognition of the usage situation. That is, in the computer apparatus of the present invention, the above described computer apparatus uses the built-in battery incorporated into the above described computer apparatus, or an external AC power supply, as its power supply source, and it is desirable for the above described storage means to store, in a relational fashion, muting as the audio volume that is suitable when the power supply source of the computer apparatus is the above described battery, and, when the above described recognizing means recognizes the above described battery as the above described power supply source, for the above described audio volume control means to mute the audio volume output from the above described built-in speaker. In the case of a notebook PC, a built-in battery is provided, but where AC power is available, power is taken from the AC power supply via an adapter. On the other hand, in a train or a conference room, for example, the built-in battery is used as the power supply source. That is to say, the permissible audio volume is limited in places where the built-in battery is used. Therefore, when the built-in battery is recognized as the power supply source, muting of the audio volume is initiated.

When the audio volume is muted, it is desirable for the user of the computer apparatus to be able to recognize the fact that muting is in effect. Knowing whether the situation is one in which there is no audio output to begin with, or one in which audio output is originally present but has been muted, enables the user to perform appropriate operation of the computer apparatus. Therefore, it is desirable for the computer apparatus of the present invention to comprise indicating means for visually indicating the fact that the above described audio volume control means has muted the audio volume.

The present invention provides the following audio apparatus that can prevent output of an unanticipated audio volume after muting is canceled. That is, the audio apparatus of the present invention comprises muting means for muting the output audio volume, and mute canceling means for canceling muting after the set value of the muted audio volume is changed during muting by the above described muting means. As the audio apparatus of the present invention is equipped with mute canceling means that both changes the muted audio volume and cancels muting, it is possible to change the audio volume when muting is canceled.

In the audio apparatus of the present invention, it is possible for the above described mute canceling means to comprise first mute canceling means for canceling muting after the set value of the muted audio volume has been increased, and second mute canceling means for canceling muting after the set value of the muted audio volume has been decreased. It is possible to meet a requirement for the audio volume to be increased after muting is canceled, and a requirement for the audio volume to be decreased after muting is canceled. The audio volume set value means the audio volume that was set before muting is performed.

A further requirement is for muting to be canceled without changing the set value of the muted audio volume. Therefore, it is also possible for the audio apparatus of the present invention to comprise third mute canceling means for canceling muting without changing the set value of the muted audio volume.

Moreover, it is desirable for the present invention to comprise audio volume indicating means for visually indicating the set value of the muted audio volume. When the set value of the muted audio volume is to be changed, an appropriate audio volume set value can be set by referring to this indication.

Also, the present invention provides a computer apparatus comprising a built-in speaker incorporated into the computer apparatus, and audio volume control means for controlling the audio volume output from the above described built-in speaker; wherein the above described audio volume control means comprises a function whereby, when the above described output audio volume is being muted, the above described output audio volume is changed before muting is canceled, and muting is canceled later.

According to this computer apparatus, the output audio volume can be changed before muting is canceled. Therefore, an appropriate audio volume can be output after muting is canceled.

DETAILED DESCRIPTION

With reference now to the attached drawings, a preferred embodiment of the present invention is provided.

Figure 2:
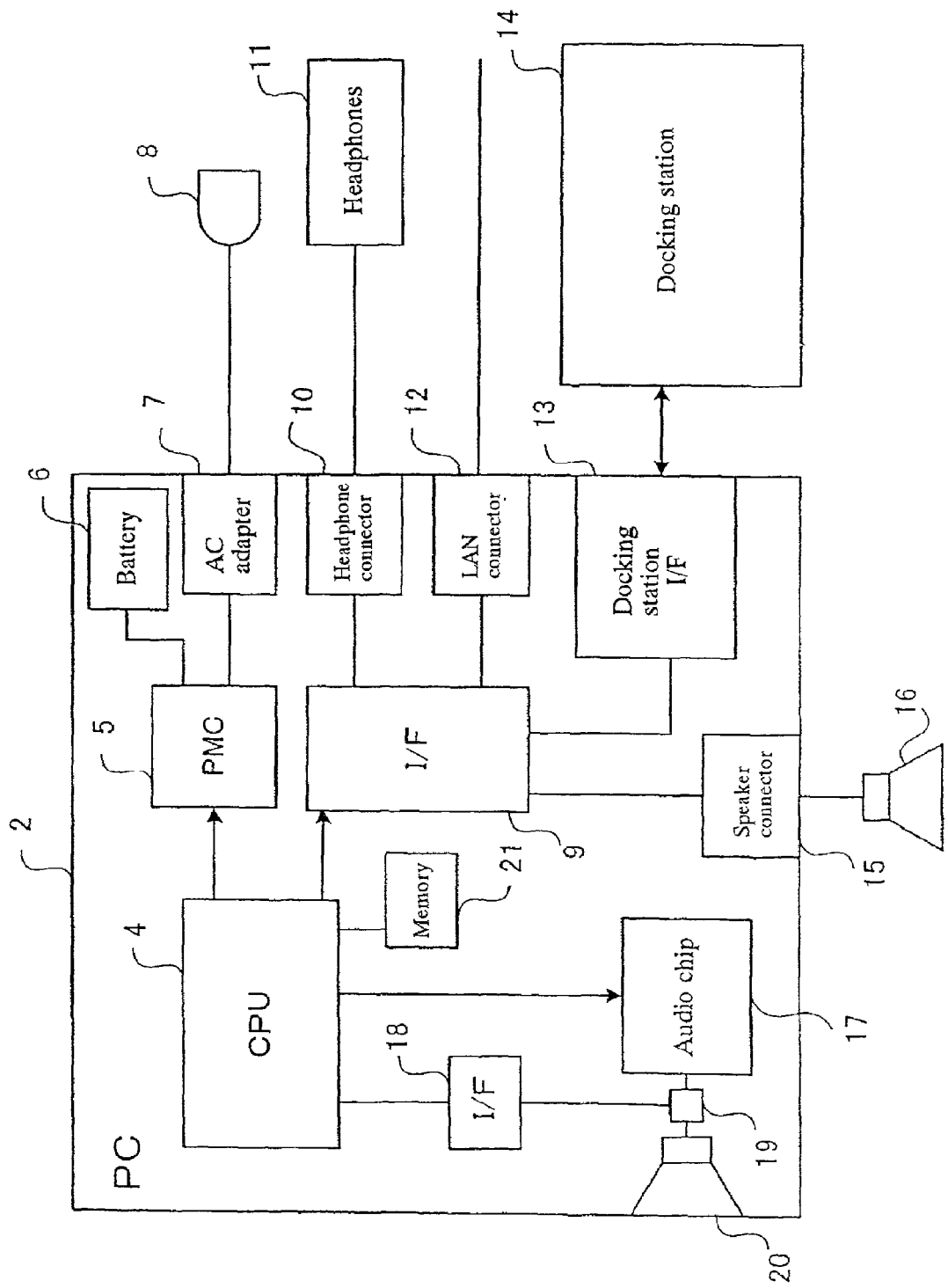
FIG. 2 is a block diagram of a main configuration of a notebook PC according to the present embodiment.

FIG. 1 is an oblique drawing of a notebook PC 1 according to the present embodiment, and FIG. 2 is a block diagram of the main configuration of the notebook PC 1 according to the present embodiment.

As shown in FIG. 1, the notebook PC 1 is configured by a PC main unit 2 and an image display unit 3. The PC main unit 2 is equipped with a keyboard 210 for operating the notebook PC 1, and component elements for executing the audio volume control method according to the present embodiment. The keyboard 210 includes a Volume Up key 210a, a Volume Down key 210b, and a Mute key 210c. A liquid crystal display apparatus, for example, can be used for the image display unit 3.

As shown in FIG. 2, the PC main unit 2 comprises a CPU (Central Processing Unit) 4, a power management controller (indicated by "PMC" in FIG. 2, and referred to as "PMC" below) 5 connected to the CPU 4, an interface (I/F) 9 connected to the CPU 4, and a built-in speaker 20 connected to the CPU 4 via an audio chip 17 or the like.

The CPU 4 controls the operation of the notebook PC 1 based on a prescribed program stored in memory 21.

The PMC 5 controls the operation of the power supply source of the notebook PC 1. The power supply source of the notebook PC 1 is a battery 6 built into the notebook PC 1 or a commercial AC power supply 8. The notebook PC 1 is connected to the AC power supply 8 via an AC adapter 7. When the AC power supply 8 is connected to the notebook PC 1, the power supply source of the notebook PC 1 is the AC power supply 8. On the other hand, when the AC power supply 8 is not connected to the notebook PC 1, the power supply source of the notebook PC 1 is the battery 6. The PMC 5 recognizes the connection situation between the notebook PC 1 and the external AC power supply 8, and controls whether the battery 6 or the AC power supply 8 is used as the power supply source.

A headphone connector 10, a LAN connector 12, and a docking station I/F 13 are connected to the interface (I/F) 9.

When the user listens to audio output from the notebook PC 1 using headphones 11, the headphones 11 are connected to the headphone connector 10 as an external audio output apparatus. When the user watches a movie stored on a DVD, or listens to music on a music CD, he or she uses the headphones 11 in a situation in which he or she does not want to output audio in the vicinity. One such situation, for example, is when the user is watching a program at high volume.

When the notebook PC 1 is connected to a LAN in an office in which that LAN has been installed, the cable for that LAN is connected to the LAN connector 12.

When the notebook PC 1 is used connected to a docking station 14, which is a kind of peripheral apparatus, the notebook PC 1 and a docking station 14 are connected via the docking station interface I/F 13. Here, the docking station 14 is a function extension apparatus for the notebook PC 1, and is also called a docking bay, extension unit, etc. The docking station 14 incorporates, for example, a CD-ROM drive, floppy disk drive, extension terminals, etc., and when the notebook PC 1 is connected, functions equivalent to a desktop personal computer can be implemented on the notebook PC 1. A docking station 14 is widely used for slim notebook PCs 1 that cannot be provided with a full range of functions. That is to say, while the portability of a slim notebook PC 1 makes it convenient to carry around, in the office its functions are extended by means of the docking station 14. Therefore, the fact that the docking station 14 and notebook PC 1 are connected indicates that the place of use is an office. Here, a docking station 14 is described, but the present invention can also be applied in the same way to the use of a port replicator, which is similar to a docking station 14.

A speaker connector 15 for connecting an external speaker 16 to the notebook PC 1 is connected to the interface (I/F) 9. The external speaker 16 is connected at the time of playing a DVD or music CD for which the sound quality of the built-in speaker 20 is unsatisfactory.

Between the built-in speaker 20 and the CPU 4 are an audio chip 17 and an attenuator 19. In the audio chip 17, the audio volume is set based on manipulation of the Volume Up/Down keys for audio volume control provided on the PC main unit 2 of the notebook PC 1. The attenuator 19 connected to the CPU 4 via an interface (I/F) 18 controls the audio volume output from the built-in speaker 20. That is, the attenuator 19 performs control of the audio volume set value in the audio chip 17 according to the external connection situation, such as the AC power supply 8 connection situation, headphones 11 connection situation, LAN connection situation, docking station 14 connection situation, and external speaker 16 connection situation. Details of the control will be described later. The controlled audio volume becomes the audio volume output from the built-in speaker 20.

Figure 3:
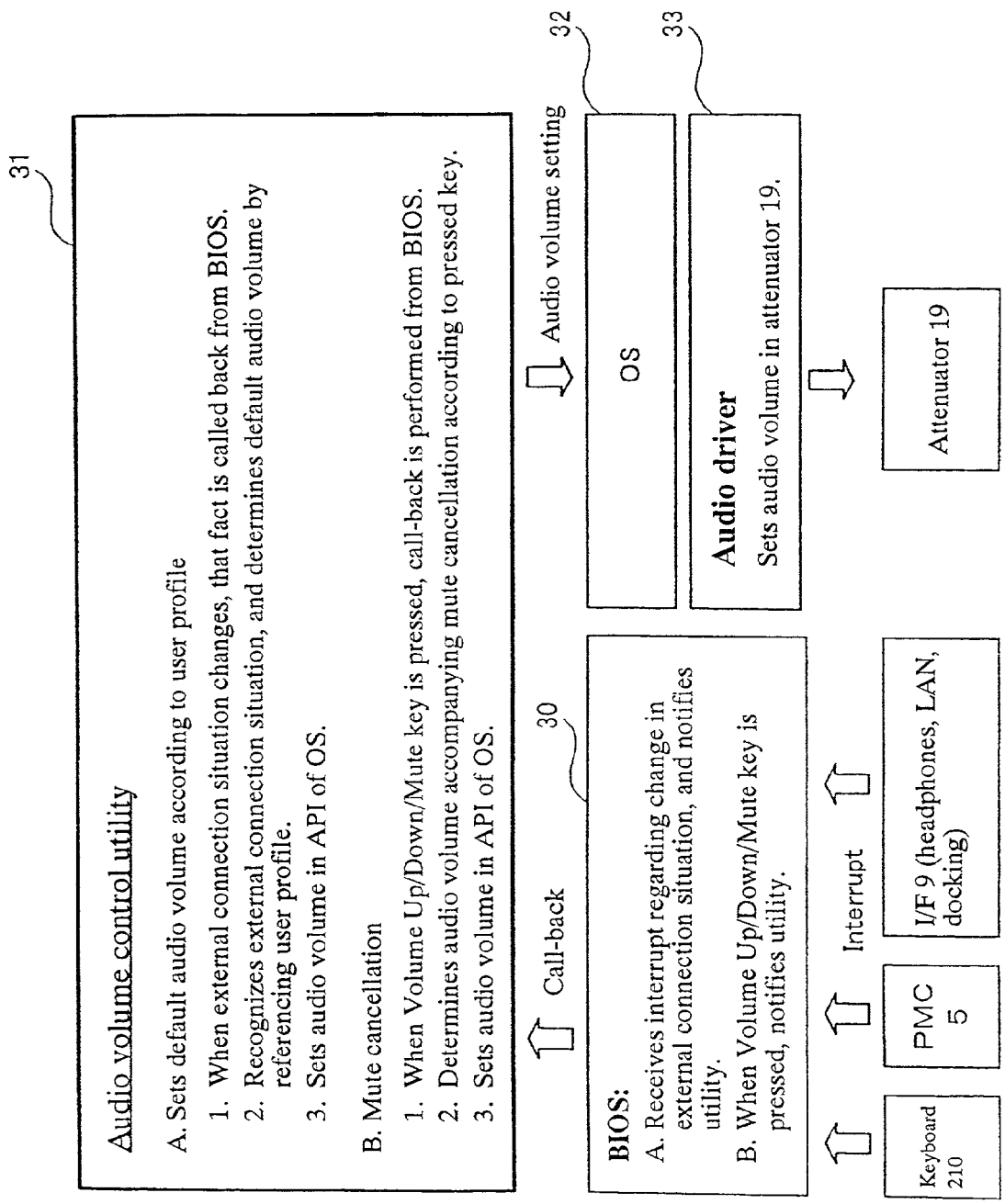
FIG. 3 is a drawing showing software modules of a notebook PC according to the present embodiment.

Next, the software modules of the notebook PC 1 will be described, based on FIG. 3. As software, the notebook PC 1 is provided with a BIOS (Basic Input/Output System) 30, an audio volume control utility 31 (referred to below as utility 31), an OS (Operating System) 32, and an audio driver 33. The utility 31 operates on receiving call-back from the BIOS 30, and the result is output to the attenuator 19 via the OS 32 and the audio driver 33.

The BIOS 30 is informed by the PMC 5 whether the power supply source is the battery 6 or the AC power supply 8, and if there is a change in the power supply source, the BIOS 30 receives notification as an interrupt. Also, on detection of the fact that the headphones 11 have been connected or disconnected, a LAN has been connected or disconnected, or the docking station 14 has been connected or disconnected, on the interface (I/F) 9, the BIOS 30 receives notification as an interrupt. When the BIOS 30 receives interrupt notification, it reports the fact to the utility 31. In addition, when the Volume Up key 210a, Volume Down key 210b, or Mute key 210c is pressed, the BIOS 30 calls back that fact to the utility 31.

The program that controls the audio volume of the notebook PC 1—that is, the utility 31—has two functions, one relating to a default audio volume setting based on a user profile, and the other relating to mute cancellation.

The default audio volume setting function executes the following three processing steps or operations.

Processing (A-1): When there is a change in the external connection situation, that fact is called back from the BIOS 30.

Processing (A-2): Recognizes the external connection situation, and determines the default audio volume by referencing a user profile.

Processing (A-3): Sets the audio volume in the API (Application Program Interface) of the OS 32.

Here, external connection refers to the AC power supply 8 connection situation, headphones 11 connection situation, LAN connection situation, docking station 14 connection situation, and external speaker 16 connection situation. The above described user profile will be described later with reference to FIG. 5. The function relating to mute cancellation executes the following three processing steps or operations.

Processing (B-1): When the Volume Up key 210a, Volume Down key 210b, or Mute key 210c is pressed, call-back is performed from the BIOS 30.

Processing (B-2): Determines the audio volume accompanying mute cancellation according to the key that is pressed.

Processing (B-3): Sets the audio volume in the API (Application Program Interface) of the OS 32.

The audio volume set in the API of the OS 32 is set in the attenuator 19 via the audio driver 33.

Figure 4:
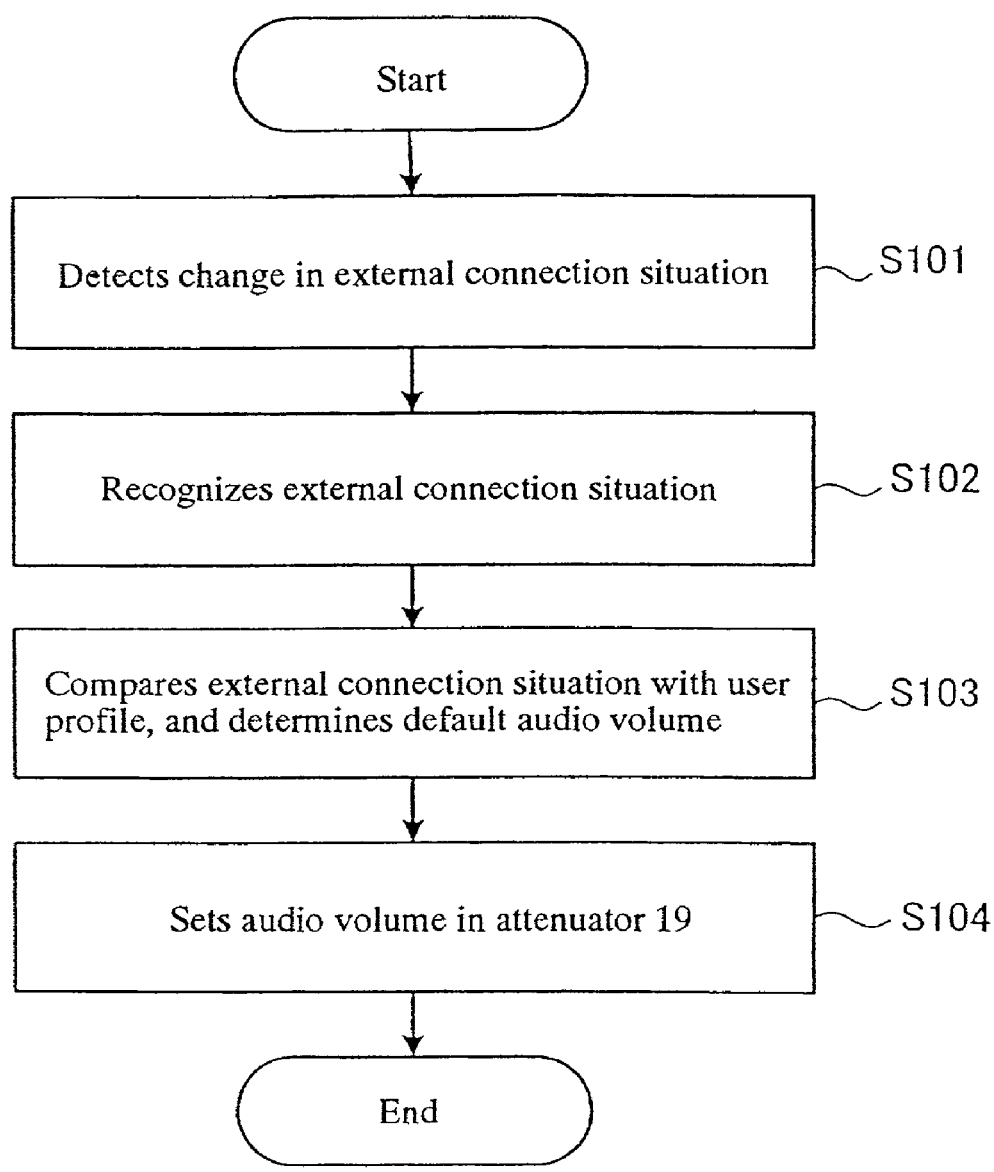
FIG. 4 is a drawing showing an audio volume setting flow in a notebook PC according to the present embodiment.

A flowchart of audio volume control for the built-in speaker 20 in a notebook PC 1 with the above configuration is shown in FIG. 4.

In FIG. 4, a change in the external connection situation is detected (S101).

When a change in the external connection situation is detected, the external connection situation is recognized via the PMC 5 and I/F 9 (S102). As stated above, this external connection situation means the AC power supply 8 connection situation, headphones 11 connection situation, LAN connection situation, docking station 14 connection situation, or external speaker 16 connection situation. For example, an external connection situation may be recognized in which the AC power supply 8, a LAN, and the docking station 14 are connected, but the headphones 11 are not.

When the external connection situation is recognized, the default audio volume is determined by referring to that connection situation and the user profile (S103). An example of this user profile is shown in FIG. 5. The user profile will be described in further detail later, but briefly, it is a table relating external connection situations to the audio volumes corresponding to those connection situations.

When the default audio volume is determined, that audio volume is set in the attenuator 19 (S104). Here, as described above, the audio volume setting in the attenuator 19 controls the audio volume set in the audio chip 17, and does not independently set the audio volume to be output from the built-in speaker 20. For example, if the audio volume set by the audio chip 17 is 10, control is performed as to whether that audio volume is output directly as 10, or is changed to 5 before output.

Next, an example of a user profile will be described, based on FIG. 5.

FIG. 5 is a table that relates hypothetical external connection situations to the audio volumes corresponding to those connection situations. This table can be set up as desired by the user. External connection situations cover connection to the AC power supply 8 (shown as "AC connection"), connection to the headphones 11 (shown as "Headphone connection"), connection to a LAN (shown as "LAN connection"), and connection to the docking station 14 (shown as "Docking connection"). In FIG. 5, "YES" indicates connection and "NO" indicates non-connection. The "YES/NO" notation indicates a YES or NO answer. The audio volume is classified into four levels: "Mute," "Low," "Fairly low," and "No change." In this example, it is assumed that a LAN is installed in the office in which the notebook PC 1 is used, and the notebook PC 1 is used connected to a docking station 14.

In the case illustrated in the line "1. Volume=Mute" in FIG. 5, when the entries for AC connection and headphone connection are "NO," the audio volume is set to "Mute" regardless of the LAN connection and docking connection situation. The fact that the notebook PC 1 is not connected to the AC power supply 8—that is, the fact that the power supply source is the battery 6—indicates the possibility that the notebook PC 1 is being carried, and is being used in a location where audio output in the vicinity is to be avoided, such as in a train, for example. Moreover, since the headphones 11 are not connected, it can said to be highly probable that the notebook PC 1 is being carried, and therefore use in a train is inferred. Therefore, the audio volume is set to "Mute" to zero the audio output from the built-in speaker 20 of the notebook PC 1.

In the case illustrated in the line "2. Volume=Low," when the entry for AC connection is "YES" and the entries for headphone connection and LAN connection are "NO," the audio volume is set to "Low" regardless of the docking connection situation. In this case, use of the notebook PC 1 in a location with access to an AC power supply 8 can be inferred from the "YES" entry for AC connection. However, extended use in a conference room can be inferred from the fact that the notebook PC 1 is not connected to a LAN. And as audio output in the vicinity is to be avoided by all means during a meeting, the audio volume is set to "Low."

In the case illustrated in the line "3. Volume=Fairly low," the entries for AC connection, LAN connection and docking connection are "YES," and the audio volume is set to "Fairly low" regardless of the headphone connection situation. Use of the notebook PC 1 in an office is inferred from the fact that it is connected to the AC power supply 8 and a LAN, and is also connected to the docking station 14. As a certain level of audio volume is not a problem in an office, the audio volume is set to "Fairly low."

In the case illustrated in the line "4. Volume=No change," the entry for headphone connection is "YES." In this case, the audio volume is set to "No change" regardless of the AC connection, LAN connection, and docking connection situation. Viewing of a DVD program at home is inferred from the fact that the headphones 11 are connected. When a DVD program is viewed at home, there is no question of disturbing people in the vicinity, and so the audio volume is set to "No change."

Here, "Mute," "Low," "Fairly low," and "No change" are qualitative indications of the coefficients applied to the audio volume set value in the audio chip 17. Assume that the audio volume set value in the audio chip 17 is 10. The settings for "Mute," "Low," "Fairly low," and "No change" will be "Mute"=0, "Low"=0.3, "Fairly low"=0.5, and "No change"=1.0. Thus, in the case of "Mute," since 10×0=0, the output audio volume is zero. Similarly, the output audio volume is 10×0.3=3 in the case of "Low," and 10×1.0=10 in the case of "No change."

As stated above, a table relating to the user profile can be set as desired by the user. FIG. 5 is just one example of such a table. Thus, connection situations for which the audio volume is set to "Mute" are not limited to the connection situations shown in the line "1. Volume=Mute." Also, in the case of entries of "NO" for AC connection, "NO" for headphone connection, "YES/NO" for LAN connection, and "YES/NO" for docking connection, as in the line "2. Volume=Low," it is also possible to set the audio volume to "Mute." Moreover, a connection situation in which the external speaker 16 is connected can also be used instead of headphone connection.

As stated above, this user profile related table is referred to at the time of setting the default audio volume. In S102 in FIG. 4, the actual connection situation of the notebook PC 1 and the AC power supply 8, etc., is recognized, and the recognized connection situation and the table in FIG. 5 are compared. As the result of the comparison, the audio volume corresponding to the connection situation in the above described table that matches the actual connection situation—that is, "Mute," "Low," "Fairly low," or "No change"—is determined as the default audio volume.

The user may also wish to cancel muting intentionally in a situation in which the notebook PC 1 is muted. In this case, the key for canceling muting is pressed. Generally, when muting is canceled the audio volume is restored to its pre-muting level. However, after canceling muting the user may wish to output audio at a volume different from that prior to muting. The notebook PC 1 therefore has a function for changing the audio volume when muting is canceled. Details of this function have already been described using FIG. 3, and the processing flow will now be described based on FIG. 6.

Figure 6:
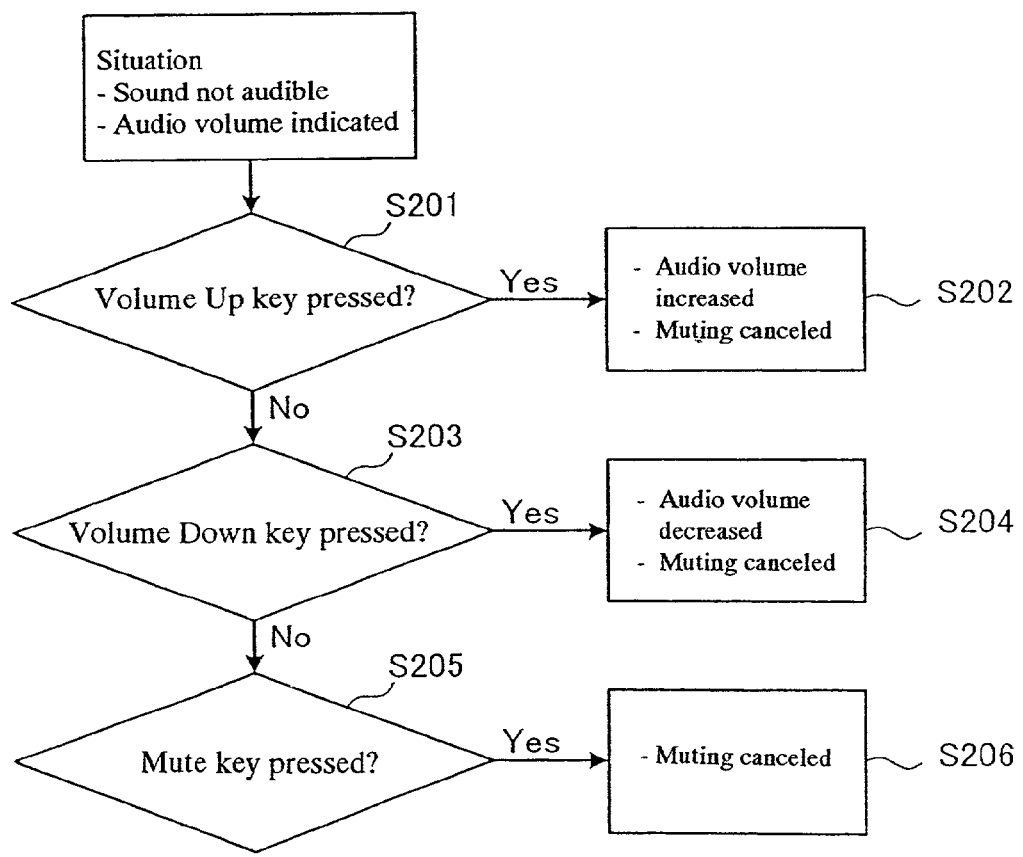
FIG. 6 is a flowchart showing control when muting is canceled in the present embodiment.

In FIG. 6, the initial state is muting. Therefore, audio cannot be heard from the notebook PC 1. Also, as will be described later, in the mute state the notebook PC 1 visually indicates the pre-muting audio volume on the image display unit 3. The user of the notebook PC 1 can thus identify the pre-muting audio volume.

When the Volume Up key 210a on the keyboard 210 is pressed in the mute state (S201), muting is canceled after the audio volume set value has been increased above the pre-muting set value (S202). When the Volume Down key 210b on the keyboard 210 is pressed in the mute state (S203), muting is canceled after the audio volume set value has been decreased below the pre-muting set value (S204). And when the Mute key 210c on the keyboard 210 is pressed in the mute state (S205), muting is canceled with the pre-muting audio volume set value maintained (S206). Muting and mute cancellation alternate each time the Mute key 210c is pressed.

As the pre-muting audio volume is visually indicated on the image display unit 3, the user can look at that indication, and if wishing to make the audio volume to be output after mute cancellation higher than that prior to muting, need only press the Volume Up key 210a. Similarly, to make the audio volume to be output after mute cancellation lower than that prior to muting, the user can press the Volume Down key 210b, and if it is not necessary to change the pre-muting audio volume, the user can press the Mute key 210c.

As for the extent to which the audio volume is increased or decreased, it is only necessary to enable this to be set according to the number of depressions, or the duration of depression, of the Volume Up key 210*a* or Volume Down key 210*b*, as with the ordinary Volume Up key 210*a* and Volume Down key 210*b* functions.

As described above, a special feature of the notebook PC 1 is the provision of two functions for the Volume Up key 210*a* and Volume Down key 210*b*: a function that enables the audio volume set value to be adjusted even in the mute state, and a function that cancels muting.

Figure 7:
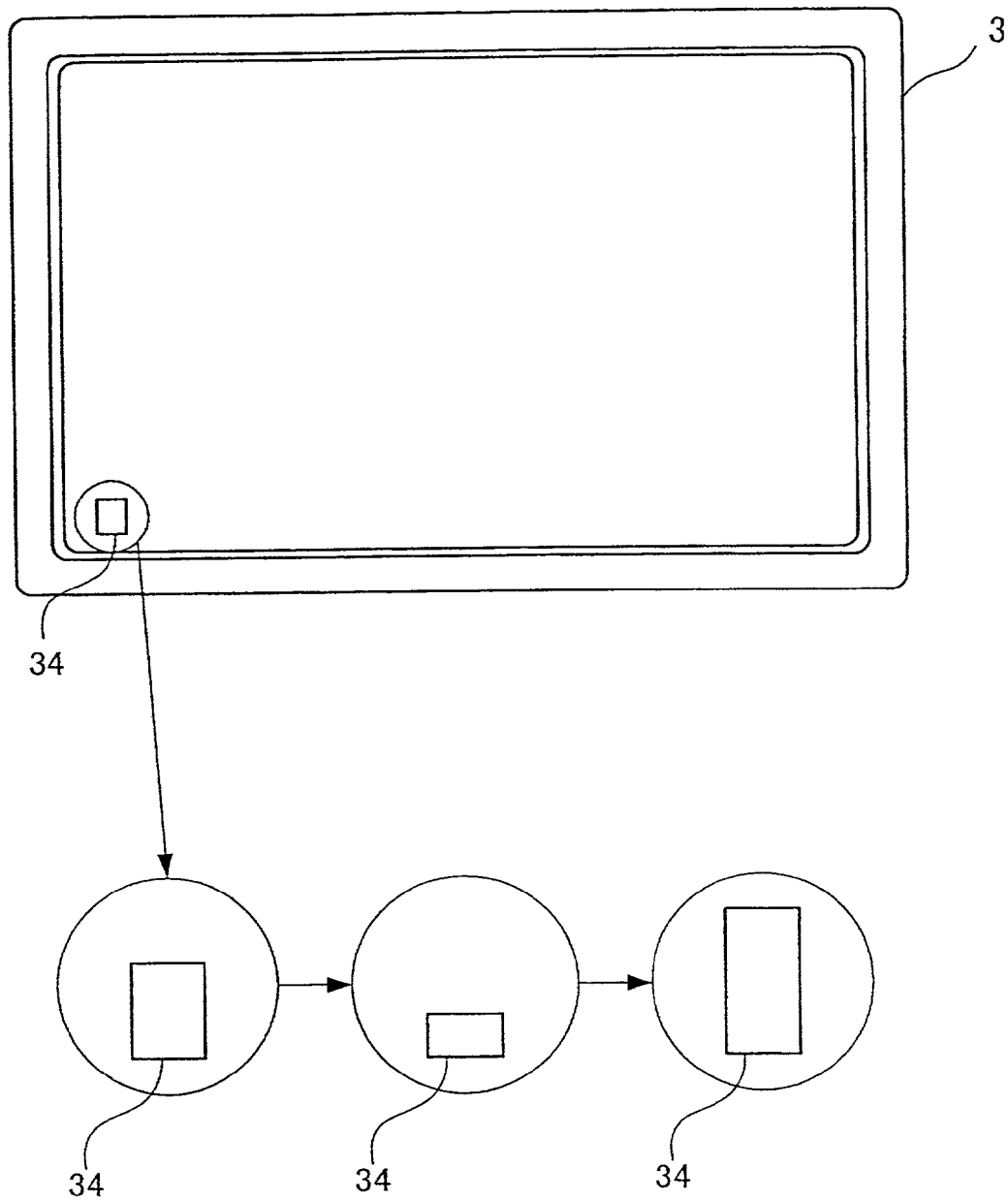
FIG. 7 is a drawing showing a display image when the notebook PC is muted in the present embodiment.

The notebook PC 1 is provided with a function for visually indicating the fact that it is in the mute state, and also the set value of the muted audio volume. A concrete example of this is shown in FIG. 7. In the mute state, a volume indicator bar 34 that shows the muted audio volume is displayed on the image display unit 3 as an icon. The volume indicator bar 34 expands or contracts as shown in FIG. 7 according to changes in the audio volume level.

According to the notebook PC 1, the user can recognize the fact that the notebook PC 1 is in the mute state by looking at this volume indicator bar 34. Moreover, the volume indicator bar 34 enables the muted audio volume to be ascertained from the expansion or contraction corresponding to a change in the audio volume level. A user who recognizes that muting is in effect will not be disconcerted if muting is canceled. Also, when muting is canceled, the user can select whether the audio volume is to be increased or decreased, and so forth.

The present invention has been described above by taking the example of a notebook PC 1, but the present invention is not limited to a notebook PC 1, and can be widely applied to apparatuses that can function as an audio apparatus. However, it is most effective for an apparatus, such as a notebook PC 1, that is used in various different locations and whose external connection situation varies.

Also, in the present embodiment, an AC power supply 8, headphones 11, a LAN, and a docking station 14 are used as the objects of the external connection situation, but it is also possible to use just one of these, or a combination of two or three of these. In addition, the situation regarding connection of another apparatus, such as an external hard disk drive or other external storage apparatus, can also be used. Moreover, in the present embodiment, an audio chip 17 and attenuator 19 are used for audio volume setting, but the present invention is not limited to this. Any means can be used as long as it comprises the two functions of the audio chip 17 and attenuator 19. This means is not limited to a hardware configuration, and software may be a component element.

As described above, according to the present invention, an audio apparatus can be provided that enables audio output to be controlled according to the place of use and usage situation.

Although the present invention and its disadvantages have been described in detail, it should be understood that various changes, substitutions and alterations can be made herein without departing from the spirit and scope of the invention as defined by the appended claims.

What is claimed is:

1. An audio apparatus, comprising:
   recognizing logic for recognizing an external connection situation;
   audio volume setting logic for setting an audio volume of audio to be output to a user of the audio apparatus, wherein said audio volume is changed according to the external connection situation recognized by said recognizing logic, wherein at least two different external connection situations are associated with different audio volumes of audio output to the user; and
   a built-in speaker for outputting said audio at the audio volume set by said audio volume setting logic,
   wherein hypothetical external connection situations and audio volumes corresponding to those external connection situations are stored in relational fashion by the audio apparatus, wherein said hypothetical external connection situations and the actual external connection situation are compared when the audio apparatus is used, and the stored audio volume corresponding to the hypothetical external connection situation that matches the actual external connection situation is selected and used as the audio volume for audio output from that audio apparatus.

2. The apparatus according to claim 1, wherein said recognizing logic recognizes one, or two or more, of power supply source connection situation, network connection situation, external voice output apparatus connection situation, and peripheral apparatus connection situation, as said external connection situation.

3. The apparatus according to claim 2, wherein said audio volume setting logic sets the audio volume according to one, or a combination of two or more, of power supply source connection situation, network connection situation, external speaker connection situation, and peripheral apparatus connection situation.

4. The apparatus according to claim 1, wherein said audio volume setting logic increases/decreases or mutes the audio volume controlled by a user according to the external connection situation.

5. An audio volume control method in an audio apparatus, wherein:
   storing hypothetical computer apparatus external connection situations and audio volumes corresponding to those external connection situations in relational fashion;
   comparing said hypothetical external connection situations and the actual external connection situation when the audio apparatus is actually used; and
   when said actual external connection situation and one of said hypothetical external connection situations match, extracting the audio volume from said storage contents according to said matching hypothetical external connection situation and using the extracted audio volume as the audio volume for audio output from that audio apparatus.

6. The method according to claim 5, wherein, when the actual external connection situation of said audio apparatus changes, said hypothetical external connection situations and the actual external connection situation are compared again, and the audio volume output from that audio apparatus is controlled on the basis of the result.

7. A computer apparatus, comprising:
   a built-in speaker incorporated into the computer apparatus;
   an audio volume control logic for controlling the audio volume of audio output from said built-in speaker;
   a storage unit for storing, in relational fashion, hypothetical computer apparatus usage situations corresponding to different places of use for the computer apparatus, and audio volumes corresponding to those usage situations; and
   a recognizing logic for recognizing the actual usage situation of the computer apparatus,
   wherein said audio volume control logic selects, on the basis of the actual usage situation recognized by said recognizing logic, an audio volume suitable for that usage situation from said storage unit and sets that selected audio volume as the audio volume of the audio output from said built-in speaker, and wherein said computer apparatus uses a battery built into said computer apparatus or an external AC power supply as a power supply source, and said storage unit performs, in a relational fashion, storage of muting as the suitable audio volume when the power supply source of the computer apparatus is said battery, wherein when said recognizing logic recognizes said battery as said power supply source, said audio volume control logic mutes the audio volume of the audio output from said built-in speaker.

8. The apparatus according to claim 7, further comprising an indicator whereby, when said audio volume control logic mutes the audio volume, the fact that the audio volume is being muted is indicated visually.

9. An audio apparatus, comprising:
a muting logic for muting the audio volume of output audio and changing a set value of the muted audio volume to a changed value during muting, wherein said muting logic is included in audio volume logic that recognizes an external connection situation of the audio apparatus and changes the audio volume of audio output to a user by said audio apparatus, and wherein said muting logic mutes the audio volume of the output audio if such muting is in accordance with the recognized external connection situation; and
a mute canceling logic for canceling muting after the set value of the muted audio volume is changed to the changed value during muting by said muting logic, wherein upon cancellation of the muting, the audio is output at the audio volume having the changed value.

10. The apparatus according to claim 9, wherein said mute canceling logic comprises:
a first mute canceling logic for canceling muting after the set value of the muted audio volume has been increased; and
a second mute canceling logic for canceling muting after the set value of the muted audio volume has been decreased.

11. The apparatus according to claim 9, comprising an audio volume indicator for visually indicating the set value of the muting audio volume.

12. The audio apparatus of claim 9 wherein the changed value is changed from the set value to an extent controlled by a user.

13. The audio apparatus of claim 9 wherein at least two different external connection situations are associated with different audio volumes of audio output to the user, wherein one of said two different external connection situations is in accordance with said muting.

14. The audio apparatus of claim 9 wherein hypothetical external connection situations and audio volumes corresponding to those external connection situations are stored in relational fashion by the audio apparatus, wherein said hypothetical external connection situations and the actual external connection situation are compared when the audio apparatus is used, and the stored audio volume corresponding to the hypothetical external connection situation that matches the actual external connection situation is selected and used as the audio volume for audio output from that audio apparatus.

15. A computer apparatus, comprising:
a built-in speaker incorporated into the computer apparatus; and
an audio volume control logic for controlling the audio volume of audio output from said built-in speaker;
wherein said audio volume control logic comprises a function whereby, when said output audio volume is being muted, said output audio volume is changed to a changed volume during muting and before muting is canceled, and muting is canceled later, such that the audio is output at the changed volume upon the cancellation of the muting, and
wherein said audio volume control logic recognizes an external connection situation of the audio apparatus by comparing the external connection situation to a plurality of stored hypothetical connection situations, and changes the audio volume of audio output to a user by said audio apparatus in accordance with the recognized external connection situation, said audio volume logic muting the audio volume of the output audio if such muting is in accordance with the recognized external connection situation.

* * * * *